United States Patent
Lou et al.

[11] Patent Number: 6,117,748
[45] Date of Patent: Sep. 12, 2000

[54] DISHING FREE PROCESS FOR SHALLOW TRENCH ISOLATION

[75] Inventors: Chine-Gie Lou, Hsinchu Hsien; Yeur-Luen Tu, Taichung; Ko-Hsing Chang, Hsinchu, all of Taiwan

[73] Assignee: Worldwide Semiconductor Manufacturing Corporation, Hsinchu, Taiwan

[21] Appl. No.: 09/060,771

[22] Filed: Apr. 15, 1998

[51] Int. Cl.$^7$ ........................................ H01L 21/76
[52] U.S. Cl. ................... 438/400; 438/692; 438/693; 438/424; 438/425
[58] Field of Search ..................... 438/400, 439, 438/424, 425, 692, 693

[56] References Cited

U.S. PATENT DOCUMENTS

| | | |
|---|---|---|
| 4,923,821 | 5/1990 | Namose . |
| 5,094,972 | 3/1992 | Pierce et al. . |
| 5,244,827 | 9/1993 | Dixit et al. . |
| 5,296,392 | 3/1994 | Grula et al. . |
| 5,316,965 | 5/1994 | Philipossian et al. . |
| 5,350,941 | 9/1994 | Madan . |
| 5,433,794 | 7/1995 | Fazan et al. . |
| 5,616,513 | 4/1997 | Shepard . |
| 5,643,823 | 7/1997 | Ho et al. . |
| 5,652,177 | 7/1997 | Pan . |
| 5,665,633 | 9/1997 | Meyer . |
| 5,886,391 | 3/1999 | Niroomand et al. ............ 257/510 |
| 5,928,961 | 7/1999 | Lou et al. .................... 438/692 |

FOREIGN PATENT DOCUMENTS 9719467  5/1997  WIPO .

*Primary Examiner*—Caridad Everhart
*Attorney, Agent, or Firm*—Blakely, Sokoloff, Taylor & Zafman L.L.P.

[57] ABSTRACT

A thin silicon dioxide layer is formed on a substrate to act as a pad oxide layer. Subsequently, a $Si_3N_4$ or BN layer is deposited on the pad oxide layer. An in situ doped polysilicon layer is deposited on the $Si_3N_4$ or BN layer. A trench is formed in the substrate. An oxide liner is formed along the walls of the trench and on the surface of the in situ doped polysilicon layer. A CVD oxide layer is formed on the oxide liner and refilled into the trench. A two-step chemical mechanical polishing (CMP) removes the layers to the surface of the $Si_3N_4$ or BN layer. The first step of the two-step CMP is an oxide slurry CMP that is stopped at about 100 to 500 angstroms from the in situ doped polysilicon layer. The second step of the two-step CMP is a poly slurry CMP that is controlled to stop at the surface of the $Si_3N_4$ or BN layer.

14 Claims, 1 Drawing Sheet

DISHING FREE PROCESS FOR SHALLOW TRENCH ISOLATION

FIELD OF THE INVENTION

The present invention relates to a method of forming isolation for integrated circuits, and more specifically, to a method of forming a shallow trench isolation.

BACKGROUND OF THE INVENTION

Semiconductor integrated circuits (ICs) have evolved towards increased density and device shrinkage. One important structure in the manufacture of ICs is isolation structures. Devices formed in the silicon substrate must be isolated from one another. Establishing effective isolation in submicron ICs in the face of decreased isolation space is a complicated and challenging task.

One conventional method for isolation involves oxidizing a bare silicon wafer in a furnace to grow a pad oxide layer of about 100 to 250 angstroms thickness. The pad oxide layer is most typically formed from silicon dioxide. A furnace nitride layer of about 1500 to 2000 angstroms thickness is then deposited on the pad oxide layer. A masking and etching step is then performed to form trenches about 0.4 to 0.5 $\mu$m in depth. A thermal oxide liner of about 150 to 300 angstroms is then grown along the etched trench sidewall and on the surface of the nitride layer. Next, oxide is then deposited in the trenches by chemical vapor deposition (CVD). The CVD oxide is then planarized by a chemical mechanical polishing (CMP).

Planarization by the CMP presents several problems. The removal rate of the CVD oxide by the CMP is higher than the removal rate of the nitride, causing dishing in wide trenches. This dishing effect degrades the planarity of a layer, and it also impacts the yield of the device. Furthermore, endpoint detection is not accurate during the CMP because the ratio of the removal rate of the CVD oxide to the removal rate of the nitride is about 3 or 4 to 1. Increasing this ratio to improve endpoint detection would result in increased dishing under this conventional method. Therefore, a need arises for a simple and efficient method of forming a trench isolation that reduces dishing, while at the same time making endpoint detection available during the CMP.

SUMMARY OF THE INVENTION

A method of forming a shallow trench isolation on a substrate is disclosed. The method comprises the steps of: forming a pad oxide layer on said substrate; forming a $Si_3N_4$ or BN layer on said pad oxide layer; forming an in situ doped polysilicon layer on said $Si_3N_4$ or BN layer; forming at least one trench in said substrate; forming an oxide liner along walls of said at least one trench and on a surface of said in situ doped polysilicon layer; forming a CVD oxide layer for isolation atop said oxide liner and said at least one trench; performing an oxide slurry CMP on said CVD oxide, said oxide slurry CMP stopping before reaching surface of said in situ doped polysilicon layer; and performing a poly slurry CMP on remaining CVD oxide and said in situ doped polysilicon layer, said poly slurry CMP stopping at a surface of said $Si_3N_4$ or BN layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
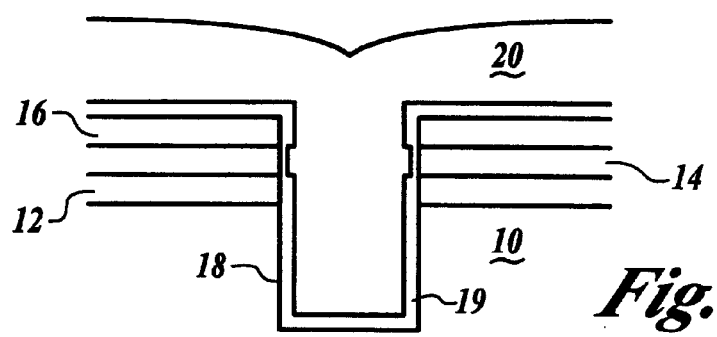
FIGS. 1, 2A, 2B, and 3 are cross-sectional views of a semiconductor substrate illustrating the steps of the present invention for forming a shallow trench isolation.

A method is disclosed to form shallow trench isolation by using a two-step chemical mechanical polishing (CMP). Referring to FIG. 1, a cross section of a semiconductor substrate with layers is shown. In the preferred embodiment, the substrate 10 can be p-type or n-type silicon. A thin silicon dioxide layer 12 is formed on the substrate 10 to act as a pad oxide layer. The pad oxide layer 12 is typically formed by using a thermal oxidation in oxygen ambient or by any suitable oxide chemical compositions and procedures. In this embodiment, the thickness of the pad oxide layer 12 is approximately 200 angstroms. Subsequently, a $Si_3N_4$ layer (approximately 800 to 1700 angstroms) or a boron nitride (BN) layer (approximately 500 to 1000 angstroms) 14 is deposited on the pad oxide layer 12 to serve as a stop layer for subsequent CMP. Any suitable conventional process can be used to deposit the $Si_3N_4$ or BN layer 14. For example, low pressure chemical vapor deposition (LPCVD), plasma enhanced chemical vapor deposition (PECVD), or high density plasma chemical vapor deposition (HDPCVD) may be used.

Still referring to FIG. 1, an in situ doped polysilicon layer 16 (about 300 to 2000 angstroms) is deposited on the $Si_3N_4$ or BN layer 14. Subsequently, a photoresist is patterned on the in situ doped polysilicon layer 16 to define the isolation region. One or more trenches 18 are formed by using a anisotropic dry etching technique. The in situ doped polysilicon layer 16, the $Si_3N_4$ or BN layer 14, the pad oxide layer 12, and the substrate 10 can respectively be etched away using conventional means. Typically, the depth of the shallow trench is about 5000 to 10000 angstroms from the surface of the in situ doped polysilicon layer 16. The photoresist is then stripped away.

Next, an oxide liner 19 is formed by thermal oxidation along the walls of the trench 18 and on the surface of the in situ doped polysilicon layer 16. Then an oxide layer 20 is formed by CVD on the oxide layer 19 and refilled into the trench 18. The oxide layer 20 formed by CVD is referred to as CVD oxide. The thickness of the CVD oxide layer 20 is about 8000 to 14000 angstroms.

Figure 2A:
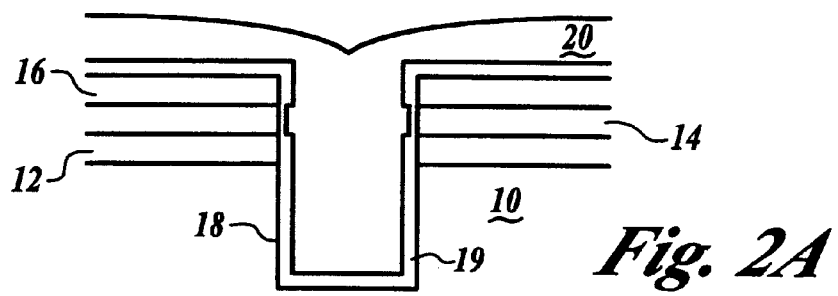
Figure 2B:
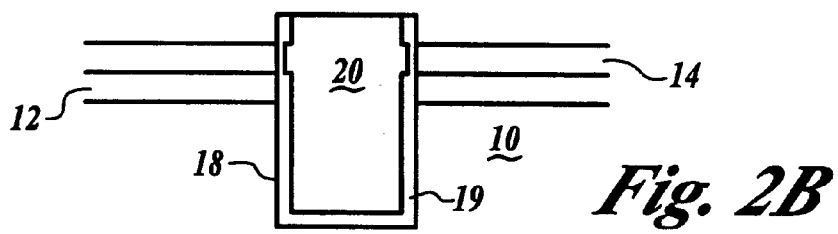

Turning to FIGS. 2A and 2B, a two-step CMP, the crux of the present invention, is performed. FIG. 2A illustrates the first step of the two-step CMP in which an oxide slurry CMP is performed. The oxide slurry CMP is preferably accomplished by the use of a cabot sc-1 slurry with an IPEC machine. In this embodiment, with a pressure of 4 pounds per square inch and at a spin rate of 30 revolutions per minute, the removal rate of CVD oxide is 1700 angstroms/min. The oxide slurry CMP is stopped at about 100 to 500 angstroms from the surface of the in situ doped polysilicon layer 16. The first step of the two-step CMP improves the throughput.

FIG. 2B illustrates the second step of the two-step CMP in which a poly slurry CMP is performed and is controlled to stop at the surface of the $Si_3N_4$ or BN layer 14. The poly slurry CMP is preferably accomplished by the use of a rodel 2371 slurry with an IPEC machine. The removal rate of the in situ doped polysilicon 16 is substantially higher than the CVD oxide 20 during the poly slurry CMP. In this embodiment, with a pressure of 4 pounds per square inch and a spin rate of 30 revolutions per minute, the removal rate of in situ doped polysilicon is 4600 angstroms/min and the removal rate of CVD oxide is 150 angstroms/min. That is, the area over the trench 18 has a lower removal rate than active areas. Thus, the second step of the two-step CMP prevents dishing as shown in FIG. 2B.

In the prior art, the primary reason for the dishing effect is that the area over the trench has a higher removal rate than active areas due to the characteristics of CMP. In the present invention, the removal rate of the CVD oxide is lower than the removal rate of the in situ doped polysilicon to prevent dishing. Furthermore, the removal rate of nitride during the poly slurry CMP is about 85 angstroms/min, while the removal rate of in situ doped polysilicon is 4600 angstroms/min. Because the ratio of the removal rate of in situ doped polysilicon to the removal rate of nitride is about 54 to 1, endpoint detection is available. By using this two-step CMP process and the in situ doped polysilicon as a sacrificial layer, dishing is prevented, while at the same time endpoint detection is made available.

Figure 3:
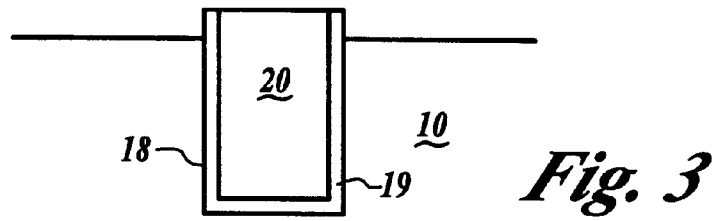

Turning to FIG. 3, the $Si_3N_4$ or BN layer 14 is then removed by using a $H_3PO_4$ solution. Subsequently, the pad oxide layer 12 is then removed by using a diluted HF solution or a buffered oxide etching (BOE) solution. The resulting structure is shown in FIG. 3.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a shallow trench isolation on a substrate, said method comprising:

forming a pad oxide layer on said substrate;

subsequent to the formation of said pad oxide layer, forming a dielectric layer on said pad oxide layer;

subsequent to the formation of said dielectric layer, forming an in situ doped polysilicon layer on said dielectric layer;

forming at least one trench in said substrate;

forming an oxide liner along walls of said at least one trench and on a surface of said in situ doped polysilicon layer;

forming a CVD oxide layer for isolation atop said oxide liner and within said at least one trench;

performing an oxide slurry CMP on said CVD oxide; said oxide slurry CMP stopping before reaching surface of said in situ doped polysilicon layer; and performing a poly slurry CMP on the remaining CVD oxide and said in situ doped polysilicon layer, said poly slurry CMP stopping at a surface of said dielectric layer.

2. The method of claim 1, further comprising:
   removing said dielectric layer; and
   removing said pad oxide layer.

3. The method of claim 1, wherein said step of forming said at least one trench includes:

patterning a photoresist on said in situ doped polysilicon layer to define a trench region;

etching said in situ doped polysilicon layer, said dielectric layer, said pad oxide layer and said substrate by using said photoresist as a mask; and removing said photoresist.

4. The method of claim 1, wherein said pad oxide layer comprises silicon dioxide.

5. The method of claim 1, wherein said dielectric layer comprises $Si_3N_4$ or BN.

6. The method of claim 1, wherein said CVD oxide layer is formed by chemical vapor deposition.

7. The method of claim 1, wherein said oxide slurry is a cabot sc-1 slurry.

8. The method of claim 1, wherein said poly slurry is a rodel 2371 slurry.

9. The method of claim 2, wherein said pad oxide layer is removed by a diluted HF solution or a buffer oxide etching (BOE) solution.

10. The method of claim 2, wherein said dielectric layer is removed by a $H_3PO_4$ solution.

11. A method of forming a shallow trench isolation on a substrate, said method comprising:

forming a pad oxide layer on said substrate;

subsequent to the formation of said pad oxide layer, forming a dielectric layer on said pad oxide layer;

subsequent to the formation of said dielectric layer, forming an in situ doped polysilicon layer on said dielectric layer;

forming at least one trench in said substrate;

forming an oxide liner along walls of said at least one trench and on a surface of said in situ doped polysilicon layer;

forming a CVD oxide layer for isolation atop said oxide liner and within said at least one trench;

performing an oxide slurry CMP on said CVD oxide; said oxide slurry CMP stopping at least 100 angstroms before reaching surface of said in situ doped polysilicon layer; and performing a poly slurry CMP on the remaining CVD oxide and said in situ doped polysilicon layer, said poly slurry CMP stopping at a surface of said dielectric layer.

12. The method of claim 11, further comprising:
    removing said dielectric layer; and
    removing said pad oxide layer.

13. The method of claim 11, wherein said oxide slurry is a cabot sc-1 slurry.

14. The method of claim 11, wherein said poly slurry is a rodel 2371 slurry.

* * * * *